(12) United States Patent
Kawase et al.

(10) Patent No.: US 10,388,589 B2
(45) Date of Patent: Aug. 20, 2019

(54) SEMICONDUCTOR DEVICE, INVERTER DEVICE, AND VEHICLE

(71) Applicant: Mitsubishi Electric Corporation, Tokyo (JP)

(72) Inventors: Tatsuya Kawase, Tokyo (JP); Mikio Ishihara, Tokyo (JP); Noboru Miyamoto, Tokyo (JP); Yosuke Nakata, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/742,536

(22) PCT Filed: Nov. 25, 2015

(86) PCT No.: PCT/JP2015/083007
§ 371 (c)(1),
(2) Date: Jan. 8, 2018

(87) PCT Pub. No.: WO2017/090106
PCT Pub. Date: Jun. 1, 2017

(65) Prior Publication Data
US 2018/0204784 A1    Jul. 19, 2018

(51) Int. Cl.
*H01L 23/473*    (2006.01)
*H01L 25/07*    (2006.01)
(Continued)

(52) U.S. Cl.
CPC ............ *H01L 23/473* (2013.01); *H01L 25/07* (2013.01); *H01L 25/072* (2013.01); *H01L 25/18* (2013.01);
(Continued)

(58) Field of Classification Search
CPC ................. H01L 25/07; H01L 25/18; H01L 2224/32225; H05K 7/20927
See application file for complete search history.

(56) References Cited

U.S. PATENT DOCUMENTS 5,316,075 A * 5/1994 Quon ..................... F28F 13/02
165/104.33
6,154,369 A    11/2000 Martinez, Jr. et al.
(Continued)

FOREIGN PATENT DOCUMENTS

JP    64-071156 A    3/1989
JP    01071156 A *    3/1989
(Continued)

OTHER PUBLICATIONS

An Office Action; "Notification of Reasons for Refusal," issued by the Japanese Patent Office dated Aug. 7, 2018, which corresponds to Japanese Patent Application No. 2017-552574 and is related to U.S. Appl. No. 15/742,536; with English language translation.
(Continued)

*Primary Examiner* — David M Sinclair
*Assistant Examiner* — Robert D Brown
(74) *Attorney, Agent, or Firm* — Studebaker & Brackett PC

(57) ABSTRACT

The object is to provide a technology capable of enhancing a cooling performance of a semiconductor device. The semiconductor device includes a fin portion including a plurality of projecting portions that are connected to a lower surface of a heat-transfer base plate, a cooling member covering the fin portion and being connected to an inlet through which coolant to flow toward the fin portion flows in and an outlet through which coolant flowing from the fin portion flows out, and a header being a water storage chamber that is provided between the inlet and the fin portion and is partitioned from the fin portion so as to be (Continued)

capable of allowing coolant to flow through from the inlet to the fin portion.

15 Claims, 6 Drawing Sheets

(51) Int. Cl.
    *H01L 25/18*     (2006.01)
    *H05K 7/20*     (2006.01)

(52) U.S. Cl.
    CPC ............... *H05K 7/20927* (2013.01); *H01L 2224/32225* (2013.01)

(56) References Cited

U.S. PATENT DOCUMENTS

| | | | |
|---|---|---|---|
| 2004/0217472 A1* | 11/2004 | Aisenbrey | H01L 23/3675 257/734 |
| 2008/0169088 A1* | 7/2008 | Aoki | H01L 23/473 165/104.19 |
| 2008/0230208 A1* | 9/2008 | Rasmussen | F28F 3/12 165/80.4 |
| 2009/0057882 A1* | 3/2009 | Gerbsch | H01L 23/473 257/714 |
| 2009/0114373 A1 | 5/2009 | Sawaguchi et al. | |
| 2010/0012294 A1* | 1/2010 | Bezama | F28F 3/12 165/80.4 |
| 2010/0302733 A1* | 12/2010 | Woody | H01L 23/473 361/699 |
| 2011/0299244 A1* | 12/2011 | Dede | F28F 3/046 361/689 |
| 2012/0152498 A1* | 6/2012 | Lyon | F28D 15/00 165/104.31 |
| 2012/0175094 A1* | 7/2012 | Rice | F28D 1/03 165/170 |
| 2013/0016477 A1* | 1/2013 | Yokoya | H01L 23/36 361/719 |
| 2013/0264702 A1* | 10/2013 | Nishi | H01L 23/36 257/712 |
| 2013/0335921 A1* | 12/2013 | Nagatonno | H01L 23/3736 361/709 |
| 2013/0343001 A1* | 12/2013 | Kwak | H01L 23/473 361/717 |
| 2014/0043765 A1* | 2/2014 | Gohara | H01L 23/3735 361/699 |
| 2014/0054762 A1* | 2/2014 | Nagaune | H01L 23/473 257/714 |
| 2014/0190669 A1 | 7/2014 | Hoshino et al. | |
| 2015/0008574 A1* | 1/2015 | Gohara | H01L 23/473 257/714 |
| 2015/0035137 A1* | 2/2015 | Nishimoto | B23K 35/3006 257/712 |
| 2015/0208550 A1* | 7/2015 | Rugg | H05K 7/20518 361/713 |
| 2015/0258645 A1 | 9/2015 | Parida | |
| 2015/0351283 A1* | 12/2015 | Yamada | F28F 13/08 165/80.4 |
| 2016/0099194 A1* | 4/2016 | Gohara | H01L 23/36 257/712 |
| 2016/0129792 A1* | 5/2016 | Gohara | H01L 23/473 310/54 |
| 2016/0293518 A1* | 10/2016 | Gohara | H01L 21/4871 |
| 2016/0307821 A1* | 10/2016 | Maruyama | H01L 23/473 |
| 2017/0332522 A1* | 11/2017 | Ushijima | H01L 23/473 |
| 2019/0014686 A1* | 1/2019 | Nakamura | H05K 7/20272 |

FOREIGN PATENT DOCUMENTS

| | | |
|---|---|---|
| JP | 11-204700 A | 7/1999 |
| JP | 11-297906 A | 10/1999 |
| JP | 2004-006811 A | 1/2004 |
| JP | 2007-141872 A | 6/2007 |
| JP | 2008-172024 A | 7/2008 |
| JP | 2009-135477 A | 6/2009 |
| JP | 2010-109079 A | 5/2010 |
| JP | 4600199 B2 | 10/2010 |
| JP | 2014-082311 A | 5/2014 |
| JP | 2014-135396 A | 7/2014 |

OTHER PUBLICATIONS

International Search Report issued in PCT/JP2015/083007; dated Feb. 23, 2016.
International Preliminary Report on Patentability issued in PCT/JP2015/083007; date Jun. 7, 2018.

* cited by examiner

US 10,388,589 B2

SEMICONDUCTOR DEVICE, INVERTER DEVICE, AND VEHICLE

TECHNICAL FIELD

The present invention relates to a semiconductor device, and an inverter device and a vehicle which include the semiconductor device.

BACKGROUND ART

A semiconductor device is constantly required to be reduced in size and weight. In order to realize the size reduction, a structure of efficiently cooling a semiconductor element is inevitable. Particularly, development of a direct cooling structure in which a semiconductor element is joined directly on a cooling fin to directly cool the semiconductor element has been promoted. Especially, development of a fin-integrated semiconductor device (e.g., Patent Document 1) and a fin-and-cooler-integrated semiconductor device (e.g., Patent Documents 2 to 5) has been actively conducted.

PRIOR ART DOCUMENTS

Patent Documents

Patent Document 1: Japanese Patent Application Laid-Open No. 11-204700 (1999)
Patent Document 2: Japanese Patent No. 4600199
Patent Document 3: Japanese Patent Application Laid-Open No. 2014-082311
Patent Document 4: Japanese Patent Application Laid-Open No. 11-297906 (1999)
Patent Document 5: Japanese Patent Application Laid-Open No. 2007-141872

SUMMARY

Problem to be Solved by the Invention

As the fin-and-cooler-integrated semiconductor device of the related art, many propositions have been made on a structure of making cooling water directly collide with a fin. In such a structure, however, the cooling water collides with and passes through the fin unevenly, raising a problem in that the semiconductor element cannot be cooled uniformly.

Accordingly, the present invention has been made in view of such problems as described above, and has an object to provide a technology capable of enhancing a cooling performance of a semiconductor device.

Means to Solve the Problem

A semiconductor device according to the present invention includes a semiconductor element, a heat-transfer base plate provided below the semiconductor element, a fin portion including a plurality of projecting portions that are connected to a lower surface of the heat-transfer base plate, a cooling member covering the fin portion and being connected to an inlet through which coolant to flow toward the fin portion flows in and an outlet through which coolant flowing from the fin portion flows out, and a header being a water storage chamber that is provided between the inlet and the fin portion and is partitioned from the fin portion so as to be capable of allowing coolant to flow through from the inlet to the fin portion.

Effects of the Invention

According to the present invention, there is provided the header being a water storage chamber that is provided between the inlet and the fin portion and is partitioned from the fin portion so as to be capable of allowing the coolant to flow through from the inlet to the fin portion. With this, coolant flowing out from the header to the fin portion collides with the fin portion under a uniformized flow state, and hence a cooling performance can be enhanced.

The object, features, aspects, and advantages of the present invention become more obvious with the following detailed description and the attached drawings.

DESCRIPTION OF EMBODIMENTS

Now, description is given to embodiments with reference to the attached drawings. Note that, the drawings are illustrated schematically, and the interrelationship of a size and a position of components illustrated in each of the different drawings is not necessarily illustrated to be accurate and may be changed as appropriate.

First Embodiment

Figure 1:
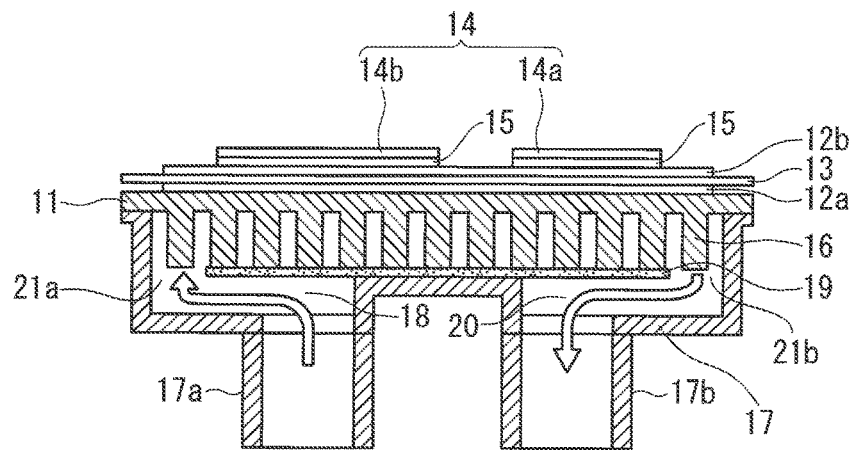
FIG. 1 is a cross-sectional view illustrating a configuration of a semiconductor device according to a first embodiment.

FIG. 1 is a cross-sectional view illustrating a configuration of a semiconductor device (cooler-integrated module) according to a first embodiment of the present invention. The semiconductor device of FIG. 1 includes a heat-transfer base plate 11, conductive patterns 12a and 12b, an insulating substrate 13 being an insulating member, a semiconductor element 14, joining members 15, a fin portion 16, a cooling member 17, a header 18 being a water storage chamber, and a water flow control plate 19 being a water flow control member. Among above, the fin portion 16, the cooling member 17, the header 18, and the water flow control plate 19 form a cooler that cools the semiconductor element 14 with use of cooling water (coolant). Note that, in FIG. 1, a direction in which the cooling water flows inside the cooler is indicated by arrows.

Next, detailed description is given to each component of the semiconductor device of FIG. 1.

The heat-transfer base plate 11 is formed of a metal plate (conductive plate) of Al (aluminum), Cu (copper), or the like, for example. The size of the heat-transfer base plate 11 is approximately 80 mm×80 mm, for example, and the thickness thereof is approximately from 2 mm to 4 mm, for example. An upper surface of the heat-transfer base plate 11 is used as a fixing surface to which the semiconductor element 14 and the like are to be fixed, and a lower surface of the heat-transfer base plate 11 is used as a heat dissipation surface to be cooled by a cooler.

The conductive patterns 12a and 12b are attached to a lower surface and an upper surface of the insulating substrate 13, respectively, and a lower surface of the conductive pattern 12a and the upper surface of the heat-transfer base plate 11 are joined by a joining member (not shown). The conductive patterns 12a and 12b are made of Al, Cu, or the like, for example, the insulating substrate 13 is made of MN (aluminum nitride), $Si_3N_4$ (Si being silicon and N being nitrogen), or the like, for example, and the joining member is made of Ag (silver) or the like, for example. Note that, the thickness of the insulating substrate 13 according to this first embodiment is set to be approximately from 0.32 mm to 1 mm. However, it is desirable that the thickness be as thin as possible in consideration of reduction in thermal resistance of the insulating substrate 13.

The semiconductor element 14 is joined to an upper surface of the conductive pattern 12b by the joining members 15 of Ag or the like, for example. With this, the above-mentioned heat-transfer base plate 11 is provided below the semiconductor element 14.

Note that, in this first embodiment, description is given supposing that the semiconductor element 14 is formed of a wide band-gap semiconductor having high heat-resisting property that is made of SiC (silicon carbide), GaN (gallium nitride), or the like, but is not to be limited thereto, and may be made of Si (silicon), for example. Note that, in a case where a wide band-gap semiconductor is used as the semiconductor element 14, the semiconductor device can be reduced in size.

Further, in this first embodiment, the semiconductor element 14 includes a first semiconductor element 14a and a second semiconductor element 14b, but the number of the semiconductor elements 14 is not to be limited thereto. In addition, in order to protect the semiconductor element 14, a case or a molding resin for covering components provided above the heat-transfer base plate 11 (e.g., semiconductor element 14) may be provided in the semiconductor device.

The fin portion 16 is connected to the lower surface of the heat-transfer base plate 11. The fin portion 16 includes a plurality of projecting portions for enhancing a cooling performance, and at least one of a pin fin, a plate fin (e.g., a straight fin and a wavy fin), and a conical fin is applied to the projecting portions. Note that, in a configuration using a pin fin as the projecting portions, a heat dissipation performance of the fin portion 16 can be enhanced. Further, in a configuration using a plate fin as the projecting portions, a heat dissipation performance can be enhanced and pressure loss can be reduced further than a pin fin.

The cooling member 17 covers the fin portion 16, and an upper portion of the cooling member 17 is connected (joined) to the lower surface of the heat-transfer base plate 11. According to the cooling member 17 as described above, cooling water in the periphery of the fin portion 16 can be enclosed.

The cooling member 17 is connected to an inlet 17a through which cooling water to flow toward the fin portion 16 flows in and an outlet 17b through which cooling water flowing from the fin portion 16 flows out. In this first embodiment, both of the inlet 17a and the outlet 17b are provided below the fin portion 16.

The header 18 is a water storage chamber that is provided between the inlet 17a and the fin portion 16 and is partitioned from the fin portion 16 so as to be capable of allowing cooling water to flow through from the inlet 17a to the fin portion 16. In this first embodiment, a water storage chamber 20 similar to the header 18 is provided between the fin portion 16 and the outlet 17b. The water storage chamber 20 is partitioned from the fin portion 16 so as to be capable of allowing cooling water to flow through from the fin portion 16 to the outlet 17b. Note that, the water storage chamber 20 need not be provided necessarily, and is omitted in fifth and sixth embodiments to be described later, for example.

An upper surface of the water flow control plate 19 is connected (joined) to a lower portion of the fin portion 16. The water flow control plate 19 partitions the header 18 and the fin portion 16 so as to be capable of allowing cooling water to flow through from the header 18 to the fin portion 16. Similarly, the water flow control plate 19 partitions the fin portion 16 and the water storage chamber 20 so as to be capable of allowing cooling water to flow through from the fin portion 16 to the water storage chamber 20.

Here, an area of the water flow control plate 19 is smaller than a floor area of the cooling member 17, and the above-mentioned cooling member 17 also covers the water flow control plate 19 in addition to the fin portion 16. With this, the header 18 and the water storage chamber 20 are formed by the water flow control plate 19 and the cooling member 17.

Figure 2:
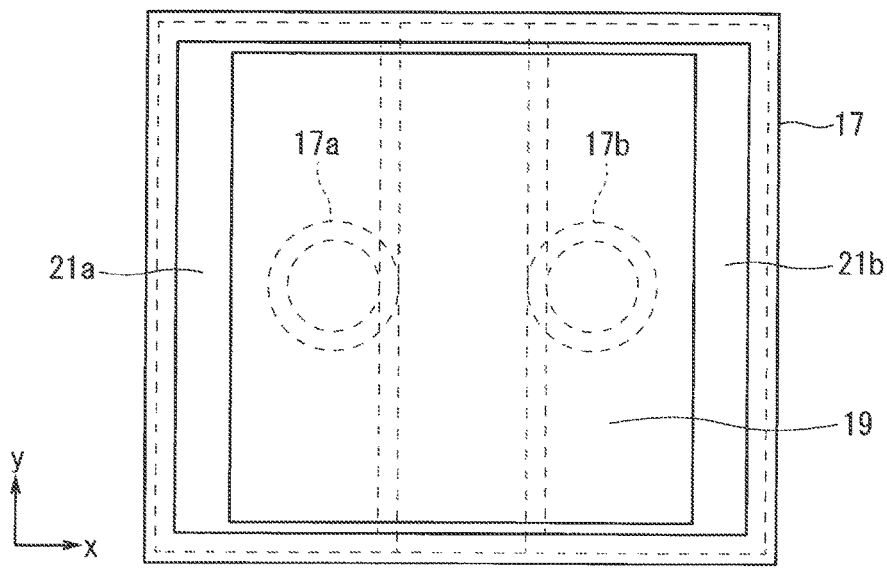
FIG. 2 is a top view illustrating a partial configuration of the semiconductor device according to the first embodiment.

FIG. 2 is a top view illustrating a partial configuration of the semiconductor device (mainly the cooling member 17 and the water flow control plate 19) according to this first embodiment. Note that, in FIG. 2, the inlet 17a, the outlet 17b, and a part of the cooling member 17 are indicated by broken lines (the same applies in FIGS. 4, 6, 8, 10, and 12). Further, in FIG. 2, an x-axis and a y-axis are indicated.

As illustrated in FIG. 2, a gap 21a capable of allowing cooling water to flow through from the header 18 to the fin portion 16 is formed between a −x side end portion of the water flow control plate 19 and an inner surface of the cooling member 17. According to such a configuration, the header 18 and the fin portion 16 are partitioned excluding the gap 21a. That is, the header 18 and the fin portion 16 are substantially partitioned, and hence cooling water flowing in from the inlet 17a is substantially prevented from directly striking against the fin portion 16.

Further, as illustrated in FIG. 2, the width of the header 18 in the y-direction is larger than the width of the inlet 17a in the y-direction, and hence, as for cross-sectional areas with respect to a flowing direction of the cooling water, a cross-sectional area of the header 18 is larger than a cross-sectional area of the inlet 17a. With this, flow of the cooling water flowing in from the inlet 17a can be moderated in the header 18. That is, the cooling water flowing in from the inlet 17a can substantially be stored in the header 18.

Note that, in this first embodiment, a gap 21b capable of allowing cooling water to flow through from the fin portion 16 to the water storage chamber 20 is also formed between a +x side end portion of the water flow control plate 19 and an inner surface of the cooling member 17.

Gist of First Embodiment

According to the configuration of this first embodiment as described above, the header 18 is provided between the inlet 17a and the fin portion 16. According to such a configuration, cooling water flowing in from the inlet 17a can be substantially prevented from directly striking against the fin portion 16 and can substantially be stored in the header 18 temporarily. With this, cooling water flowing out from the header 18 to the fin portion 16 collides with the fin portion 16 under a uniformized flow state, and hence a cooling performance (e.g., uniformity and stability of the cooling) can be enhanced.

Note that, in a top view of FIG. 2, when the gap 21a and the inlet 17a are arranged so as not to overlap with each other, cooling water from the inlet 17a can be prevented from directly striking against the fin portion 16. However, even when the gap 21a and the inlet 17a are arranged so as to partially overlap with each other, cooling water from the inlet 17a can be prevented from directly striking against the fin portion 16 to a certain extent.

Further, as in FIG. 2, when the gap 21a and the gap 21b are arranged to be close to one end portion and another end portion of the fin portion 16, respectively, cooling water can be circulated throughout the fin portion 16, and hence a cooling performance can further be enhanced.

Further, in this first embodiment, both of the inlet 17a and the outlet 17b are provided below the fin portion 16. With this, the crosswise size of the entire semiconductor device (module), that is, a floor area of the entire semiconductor device (module), can be reduced, and hence the semiconductor device (module) can be expected to be reduced in size. Note that, even in a configuration in which any one of the inlet 17a and the outlet 17b is provided below the fin portion 16, the floor area of the entire semiconductor device (module) can be reduced to a certain extent.

Further, in this first embodiment, the water flow control plate 19 that partitions the header 18 and the fin portion 16 so as to be capable of allowing cooling water to flow through from the header 18 to the fin portion 16 is provided. With this, the header 18 can be formed with ease.

Second Embodiment

Figure 3:
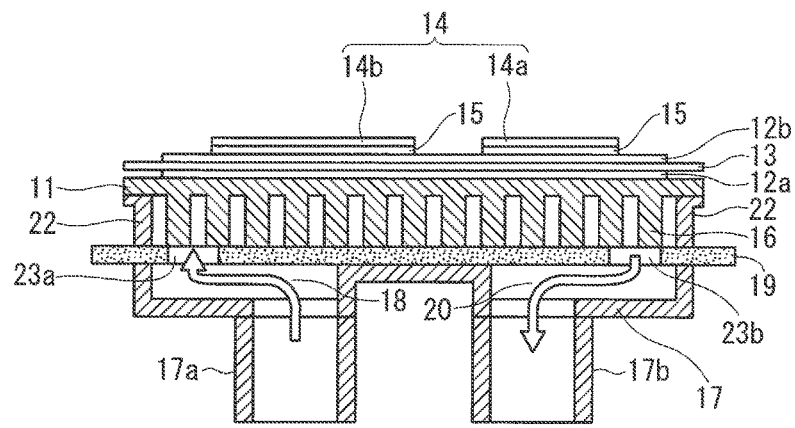
FIG. 3 is a cross-sectional view illustrating a configuration of the semiconductor device according to a second embodiment.
Figure 4:
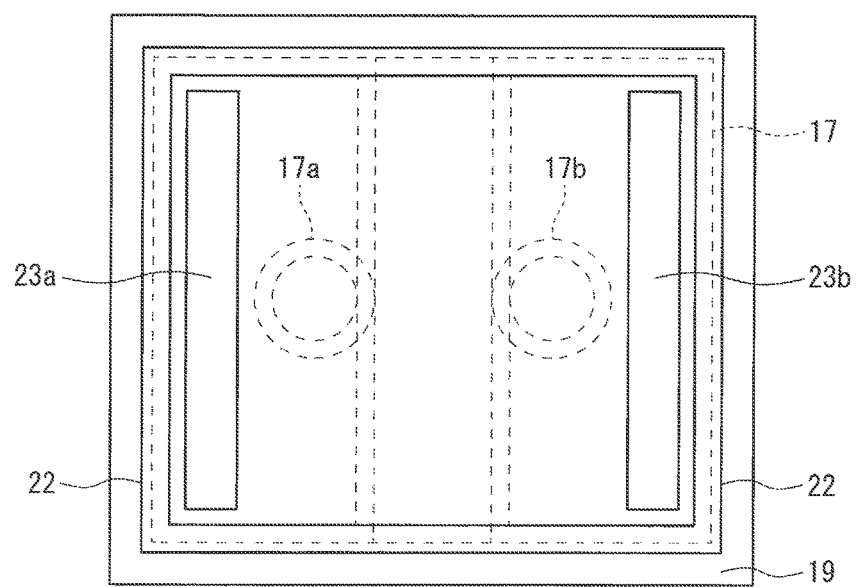
FIG. 4 is a top view illustrating a partial configuration of the semiconductor device according to the second embodiment.

FIG. 3 is a cross-sectional view illustrating a configuration of the semiconductor device (cooler-integrated module) according to a second embodiment of the present invention, and FIG. 4 is a top view illustrating a partial configuration of the semiconductor device. In the description below, components of the semiconductor device according to this second embodiment that are the same as or similar to those of the first embodiment are denoted by the same reference symbols, and different components are mainly described.

The semiconductor device according to this second embodiment includes, in addition to the components of the first embodiment, a fin outer-peripheral frame 22 being an outer-peripheral frame.

The fin outer-peripheral frame 22 is connected to the lower surface of the heat-transfer base plate 11, and surrounds a periphery of the fin portion 16. The height of the fin outer-peripheral frame 22 is equal to the height of the fin portion 16, and a lower portion of the fin outer-peripheral frame 22 and a lower portion of the fin portion 16 are connected (joined) to the water flow control plate 19. According to the fin outer-peripheral frame 22 as described above, cooling water in the periphery of the fin portion 16 can be enclosed. Note that, material quality of the fin outer-peripheral frame 22 may be the same as material quality of the fin portion 16.

The upper surface of the water flow control plate 19 is connected (joined) to the fin outer-peripheral frame 22 and the fin portion 16, and a lower surface of the water flow control plate 19 is connected (joined) to an upper portion of the cooling member 17. With this, the header 18 and the water storage chamber 20 are formed by the water flow control plate 19 and the cooling member 17.

In the water flow control plate 19, a slit 23a capable of allowing cooling water to flow through from the header 18 to the fin portion 16, and a slit 23b capable of allowing cooling water to flow through from the fin portion 16 to the water storage chamber 20 are formed. Note that, the slits 23a and 23b are arranged to be close to one end portion and another end portion of the fin portion 16, respectively.

Further, the area of the water flow control plate 19 is larger than any of an area of a portion surrounded by the fin outer-peripheral frame 22 in a top view and an area of a portion surrounded by an outer peripheral portion (upper portion) of the cooling member 17 in a top view.

Gist of Second Embodiment

According to this second embodiment as described above, the header 18 similar to the first embodiment is provided. For this reason, according to this second embodiment, similarly to the first embodiment, cooling water flowing out from the header 18 to the fin portion 16 collides with the fin portion 16 under a uniformized flow state, and hence a cooling performance (e.g., uniformity and stability of the cooling) can be enhanced.

Further, in this second embodiment, the area of the water flow control plate 19 is larger than any of the area of the portion surrounded by the fin outer-peripheral frame 22 in a top view and the area of the portion surrounded by the outer peripheral portion of the cooling member 17 in a top view. With this, a clearance between the water flow control plate 19 and the cooling member 17 in a surface direction can be eliminated. As a result, the fin portion 16, further, the semiconductor element 14, can be cooled more efficiently, and hence a cooling performance can further be enhanced.

Third Embodiment

Figure 5:
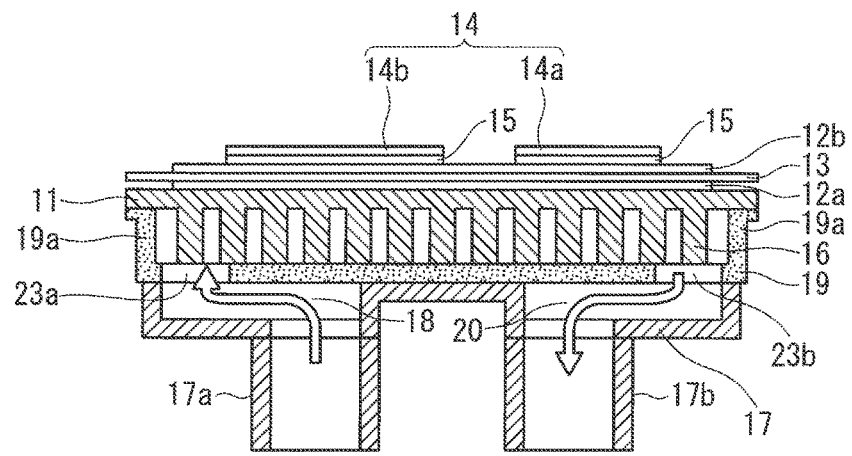
FIG. 5 is a cross-sectional view illustrating a configuration of the semiconductor device according to a third embodiment.
Figure 6:
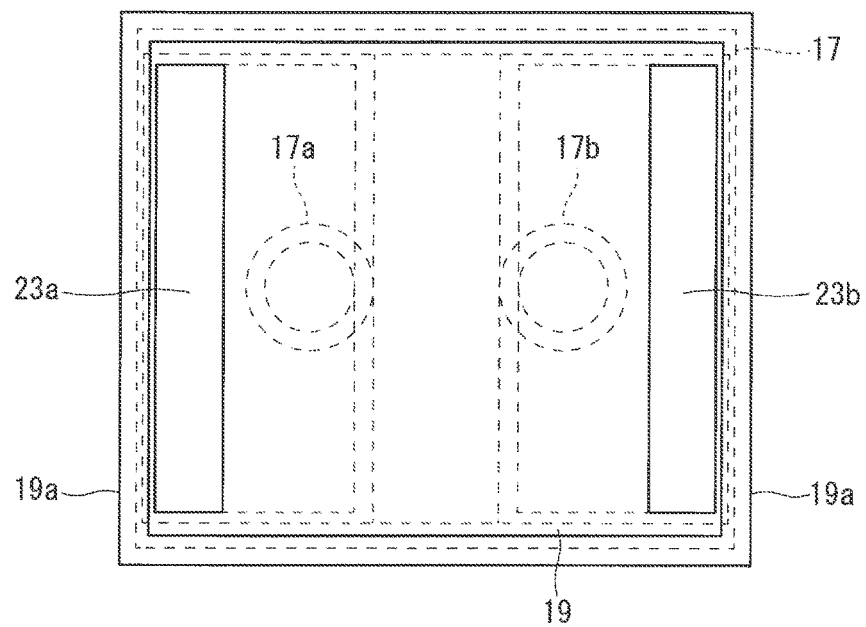
FIG. 6 is a top view illustrating a partial configuration of the semiconductor device according to the third embodiment.

FIG. 5 is a cross-sectional view illustrating a configuration of the semiconductor device (cooler-integrated module) according to a third embodiment of the present invention, and FIG. 6 is a top view illustrating a partial configuration of the semiconductor device. In the description below, components of the semiconductor device according to this third embodiment that are the same as or similar to those of the first embodiment are denoted by the same reference symbols, and different components are mainly described.

In the second embodiment, the fin outer-peripheral frame 22 is provided. In this third embodiment, however, an end portion 19a of the water flow control plate 19 is used instead of the fin outer-peripheral frame 22.

Specifically, in this third embodiment, the upper surface of the water flow control plate 19 is connected (joined) to the fin portion 16, and the lower surface of the water flow control plate 19 is connected (joined) to an upper portion of the cooling member 17. With this, the header 18 and the water storage chamber 20 are formed by the water flow control plate 19 and the cooling member 17.

In the water flow control plate 19, the slit 23a capable of allowing cooling water to flow through from the header 18 to the fin portion 16, and the slit 23b capable of allowing cooling water to flow through from the fin portion 16 to the water storage chamber 20 are formed. Note that, the slits 23a and 23b are arranged to be close to one end portion and another end portion of the fin portion 16, respectively.

The area of the water flow control plate 19 is larger than the area of the portion surrounded by the outer peripheral portion (upper portion) of the cooling member 17 in a top view. Further, the end portion 19a of the water flow control plate 19 is bent toward the heat-transfer base plate 11 side to be connected to the heat-transfer base plate 11, and surrounds the periphery of the fin portion 16.

Gist of Third Embodiment

According to this third embodiment as described above, the header 18 similar to the first embodiment is provided, and hence a cooling performance (e.g., uniformity and stability of the cooling) can be enhanced similarly to the first embodiment. Further, similarly to the second embodiment, a clearance between the water flow control plate 19 and the cooling member 17 in a surface direction can be eliminated.

In addition, in this third embodiment, the end portion 19a of the water flow control plate 19 is bent toward the heat-transfer base plate 11 side to be connected to the heat-transfer base plate 11, and surrounds the periphery of the fin portion 16. With this, the fin outer-peripheral frame 22 described in the second embodiment need not be provided, and hence the number of components and a joining process can be reduced.

Fourth Embodiment

Figure 7:
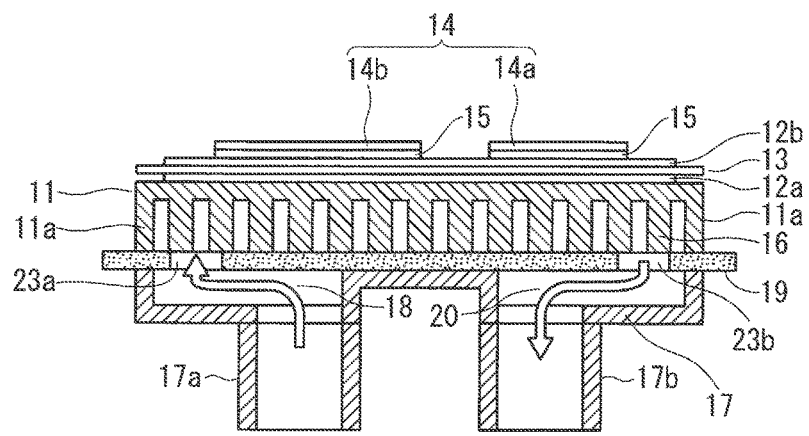
FIG. 7 is a cross-sectional view illustrating a configuration of the semiconductor device according to a fourth embodiment.
Figure 8:
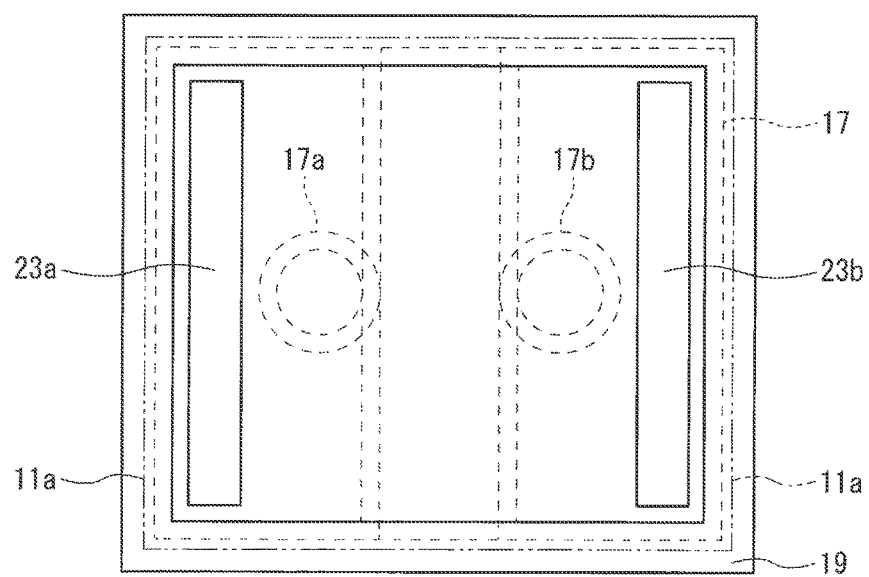
FIG. 8 is a top view illustrating a partial configuration of the semiconductor device according to the fourth embodiment.

FIG. 7 is a cross-sectional view illustrating a configuration of the semiconductor device (cooler-integrated module) according to a fourth embodiment of the present invention, and FIG. 8 is a top view illustrating a partial configuration of the semiconductor device. In the description below, components of the semiconductor device according to this fourth embodiment that are the same as or similar to those of the first embodiment are denoted by the same reference symbols, and different components are mainly described.

In the third embodiment, the end portion 19a (FIG. 5) of the water flow control plate 19 is used instead of the fin outer-peripheral frame 22. In this fourth embodiment, however, an end portion 11a (FIG. 8) of the heat-transfer base plate 11 is used instead of the fin outer-peripheral frame 22.

Specifically, in this fourth embodiment, the upper surface of the water flow control plate 19 is connected (joined) to the fin portion 16, and the lower surface of the water flow control plate 19 is connected (joined) to an upper portion of the cooling member 17. With this, the header 18 and the water storage chamber 20 are formed by the water flow control plate 19 and the cooling member 17.

In the water flow control plate 19, the slit 23a capable of allowing cooling water to flow through from the header 18 to the fin portion 16, and the slit 23b capable of allowing cooling water to flow through from the fin portion 16 to the water storage chamber 20 are formed. Note that, the slits 23a and 23b are arranged to be close to one end portion and another end portion of the fin portion 16, respectively.

The area of the water flow control plate 19 is larger than the area of the portion surrounded by the outer peripheral portion (upper portion) of the cooling member 17 in a top view. Further, the end portion 11a of the heat-transfer base plate 11 is bend toward the water flow control plate 19 side to be connected to the water flow control plate 19, and surrounds the periphery of the fin portion 16.

Gist of Fourth Embodiment

According to this fourth embodiment as described above, the header 18 similar to the first embodiment is provided, and hence a cooling performance (e.g., uniformity and stability of the cooling) can be enhanced similarly to the first embodiment. Further, similarly to the second embodiment, a clearance between the water flow control plate 19 and the cooling member 17 in a surface direction can be eliminated.

In addition, in this fourth embodiment, the end portion 11a of the heat-transfer base plate 11 is bend toward the water flow control plate 19 side to be connected to the water flow control plate 19, and surrounds the periphery of the fin portion 16. With this, the fin outer-peripheral frame 22 described in the second embodiment need not be provided, and hence the number of components and a joining process can be reduced.

Fifth Embodiment

Figure 9:
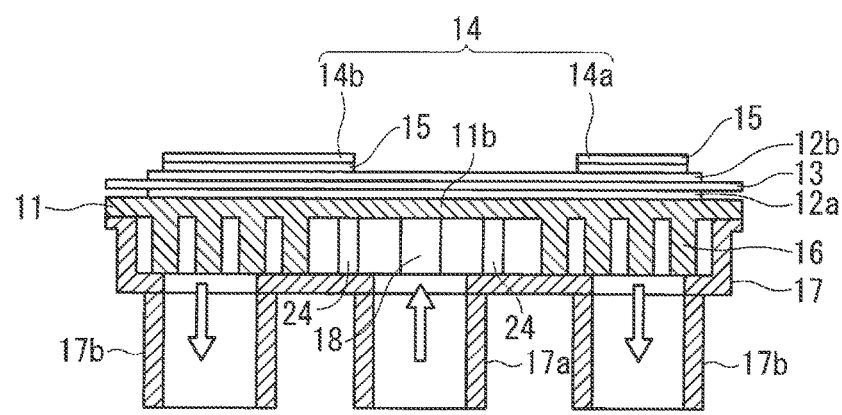
FIG. 9 is a cross-sectional view illustrating a configuration of the semiconductor device according to a fifth embodiment.
Figure 10:
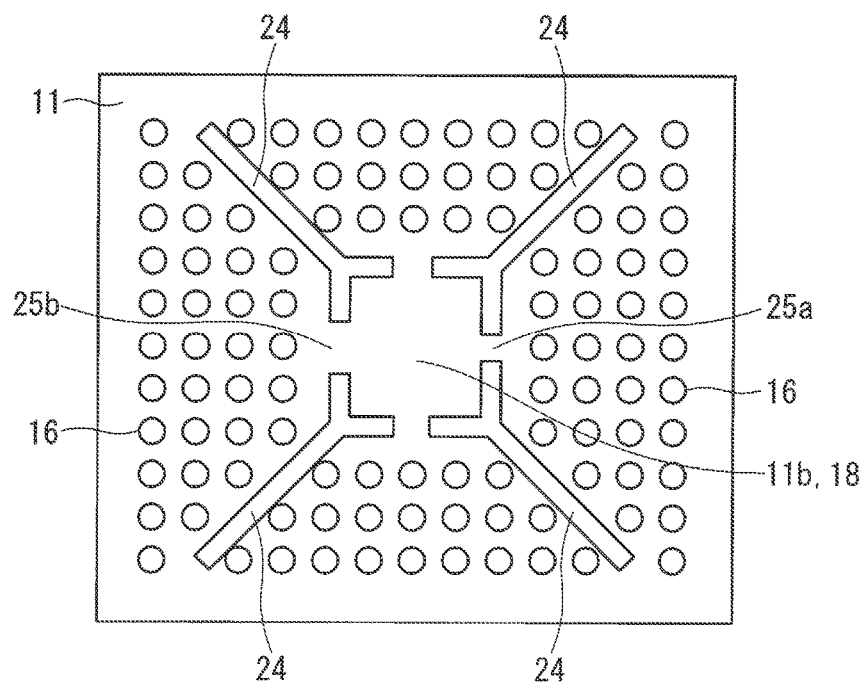
FIG. 10 is a bottom view illustrating a partial configuration of the semiconductor device according to the fifth embodiment.

FIG. 9 is a cross-sectional view illustrating a configuration of the semiconductor device (cooler-integrated module) according to a fifth embodiment of the present invention, and FIG. 10 is a bottom view illustrating a partial configuration of the semiconductor device. In the description below, components of the semiconductor device according to this fifth embodiment that are the same as or similar to those of the first embodiment are denoted by the same reference symbols, and different components are mainly described.

In this fifth embodiment, the inlet 17a is provided below the heat-transfer base plate 11. Water flow control members 24 are perpendicularly connected (joined) to the lower surface of the heat-transfer base plate 11 so as to surround an upper portion 11b being a portion of the heat-transfer base plate 11 positioned above the inlet 17a. Further, a lower portion of the water flow control members 24 is connected (joined) to a bottom surface of the cooling member 17. With this, the header 18 is formed by the upper portion 11b, the water flow control members 24, and the cooling member 17.

Note that, the water flow control members 24 are formed of four extending portions that extend substantially in a Y-like shape in a surface direction of the heat-transfer base plate 11. Further, the four extending portions have, not only a portion for surrounding the header 18 (portion formed correspondingly to four sides of a substantially quadrangular shape in FIG. 10), but also a portion for circulating cooling water from the header 18 throughout the fin portion 16 (portion formed substantially correspondingly to diagonal lines of the heat-transfer base plate 11 in FIG. 10).

On a portion of the heat-transfer base plate 11 other than the upper portion 11b, the fin portion 16 is provided. On the other hand, on the upper portion 11b of the heat-transfer base plate 11 (the header 18), the fin portion 16 is omitted or a fin portion having a height lower than the fin portion 16 (not shown) is provided.

Here, in this fifth embodiment, in a case where the semiconductor device is used, heat generation of the second semiconductor element 14b is larger than heat generation of the first semiconductor element 14a. Further, the water flow control members 24 have a first slit 25a capable of allowing cooling water to flow through from the header 18 to the fin portion 16 that is provided below the first semiconductor element 14a. Further, the water flow control members 24 have a second slit 25b capable of allowing cooling water to flow through from the header 18 to the fin portion 16 that is provided below the second semiconductor element 14b. Here, the width of the second slit 25b is larger than the width of the first slit 25a.

Gist of Fifth Embodiment

According to this fifth embodiment as described above, the header 18 similar to the first embodiment is provided, and hence a cooling performance (e.g., uniformity and stability of the cooling) can be enhanced similarly to the first embodiment.

Further, in the first to fourth embodiments, the header 18 is provided on a lower side with respect to the fin portion 16. In contrast, in this fifth embodiment, the header 18 is provided on a lateral side of the fin portion 16. With this, the size of the entire semiconductor device (module) in the thickness direction can be reduced, and hence the semiconductor device (module) can be expected to be reduced in size.

Further, according to this fifth embodiment, the width of the second slit 25b corresponding to the second semiconductor element 14b having comparatively large heat generation is larger than the width of the first slit 25a corresponding to the first semiconductor element 14a having comparatively small heat generation. According to such a configuration, a cooling performance on the second semiconductor element 14b side can be enhanced further than a cooling performance on the first semiconductor element 14a side through adjustment of the width of the first and second slits 25a and 25b, and hence a cooling performance with respect to the first and second semiconductor elements 14a and 14b can be made proper.

For example, in a case where the semiconductor device according to this fifth embodiment is a hybrid module formed of an insulated gate bipolar transistor (Si-IGBT) and a schottky barrier diode (SiC-SBD), the SiC-SBD having comparatively small heat generation quantity is used as the first semiconductor element 14a, and the Si-IGBT having comparatively large heat generation quantity is used as the second semiconductor element 14b. In this case, the width of the second slit 25b of the Si-IGBT is larger than the width of the first slit 25a of the SiC-SBD, and hence the cooling of the entire module can be made proper.

Sixth Embodiment

Figure 11:
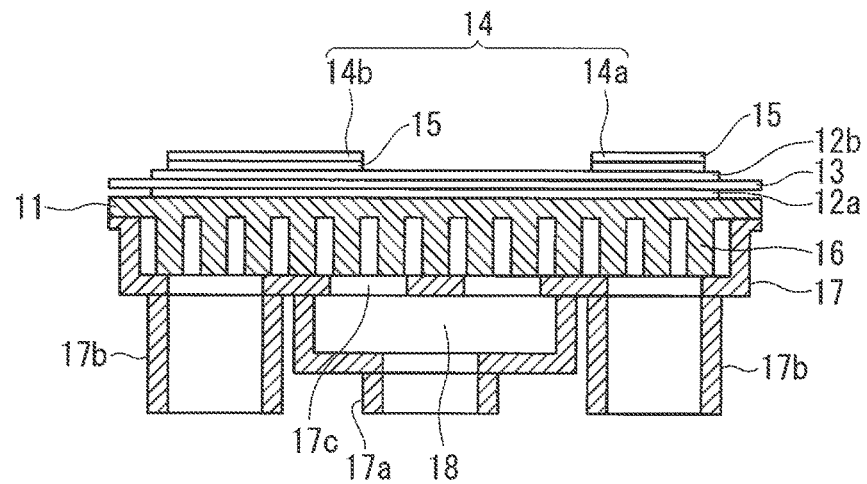
FIG. 11 is a cross-sectional view illustrating a configuration of the semiconductor device according to a sixth embodiment.
Figure 12:
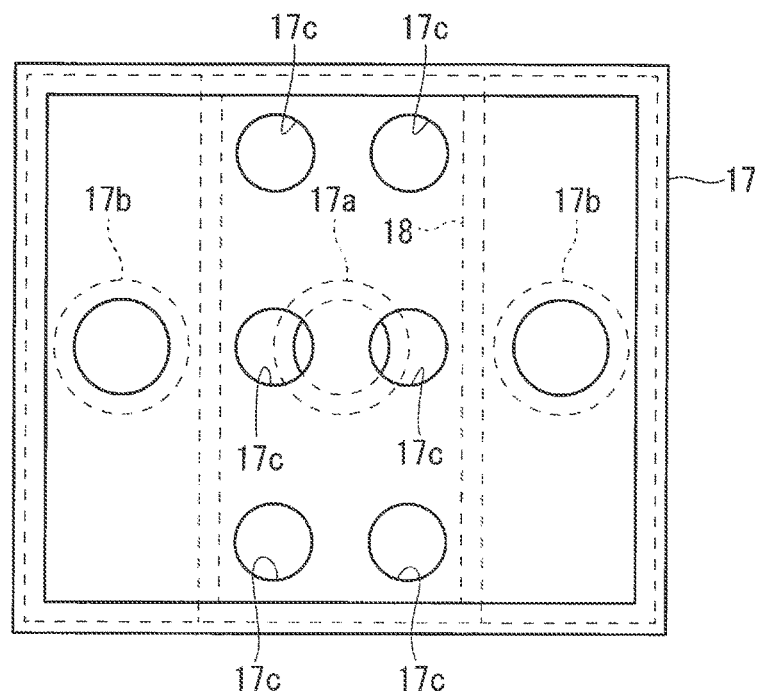
FIG. 12 is a top view illustrating a partial configuration of the semiconductor device according to the sixth embodiment.

FIG. 11 is a cross-sectional view illustrating a configuration of the semiconductor device (cooler-integrated module) according to a sixth embodiment of the present invention, and FIG. 12 is a top view illustrating a partial configuration of the semiconductor device. In the description below, components of the semiconductor device according to this sixth embodiment that are the same as or similar to those of the first embodiment are denoted by the same reference symbols, and different components are mainly described.

The semiconductor device according to this sixth embodiment does not include either of the water flow control plate 19 or the water flow control members 24. Further, the header 18 is provided outside the cooling member 17. Specifically, the header 18 is provided between the inlet 17a and a bottom surface of the cooling member 17 that is connected to the inlet 17a. Further, a plurality of water passage holes 17c capable of allowing cooling water to flow through from the header 18 to the fin portion 16 are formed in the bottom surface of the cooling member 17.

Gist of Sixth Embodiment

According to this sixth embodiment as described above, the header 18 similar to the first embodiment is provided, and hence a cooling performance (e.g., uniformity and stability of the cooling) can be enhanced similarly to the first embodiment.

Further, in this sixth embodiment, the plurality of water passage holes 17c capable of allowing cooling water to flow through from the header 18 to the fin portion 16 are formed in the bottom surface of the cooling member 17 that defines the header 18. According to such a configuration, a desired area can be cooled preferentially by providing the header 18 and the water passage holes 17c in the desired area. For example, the entire semiconductor device (module) can be cooled efficiently by providing the header 18 and the water passage holes 17c below an area where the semiconductor element 14 having large heat generation is provided.

Modified Examples

In the above, a material having high rigidity (Cu or an Al alloy) may be used for at least one of the heat-transfer base plate 11 (first to sixth embodiments), the water flow control plate 19 (first to fourth embodiments), the fin outer-peripheral frame 22 (second embodiment), and the water flow control members 24 (sixth embodiment). According to such a configuration, a component made of a material having high rigidity can have a function as a beam, and hence rigidity of the entire semiconductor device (module) can be enhanced. For this reason, a resin-based material having comparatively low rigidity but capable of being reduced in weight can be used as a material for the cooling member 17. As a result, the semiconductor device (module) can be reduced in cost, weight, and size with ease. Particularly, in a case where a resin having high insulation property is used as a material for the cooling member 17, a distance for insulation can be designed to be short as compared to a metallic cooling member of the related art, and hence the semiconductor device can further be reduced in size.

Further, the fin portion 16 and the heat-transfer base plate 11 may be connected by a joining member (not shown) of Ag or the like, for example. According to such a configuration, components other than the fin portion 16 can be commonized, and an optimal fin can be applied to the fin portion 16 in each occasion. Accordingly, a semiconductor device capable of performing proper cooling in accordance with a situation of heat generation of the semiconductor element 14 can be realized. Note that, in a case where such an effect is unnecessary, for example, a part of the heat-transfer base plate 11 may be processed to form the fin portion 16.

Further, the semiconductor device described above may be provided in an inverter device or may be provided in a vehicle (e.g., a motor control circuit in a vehicle capable of being driven by a motor). With this, a semiconductor device enhanced in cooling performance can be used as a semiconductor device of an inverter device and a vehicle.

Note that, in the present invention, each of the embodiments and each of the modified examples may be freely combined, and each of the embodiments and each of the modified examples may be modified or omitted as appropriate within the scope of the invention.

The present invention has been described in detail, but the description above is merely an example in all aspects, and the present invention is not to be limited thereto. It is understood that numerous modified examples not illustrated herein are assumable without departing from the scope of the present invention.

EXPLANATION OF REFERENCE SIGNS 11 heat-transfer base plate, 11b upper portion, 14 semiconductor element, 14a first semiconductor element, 14b second semiconductor element, 16 fin portion, 17 cooling member, 17a inlet, 17b outlet, 17c water passage hole, 18 header, 19 water flow control plate, 22 fin outer-peripheral frame, 23a slit, 24 water flow control member, 25a first slit, 25b second slit.

The invention claimed is:

1. A semiconductor device comprising:
   a semiconductor element;
   a heat-transfer base plate provided below the semiconductor element;
   a fin portion including a plurality of projecting portions that are connected to a lower surface of the heat-transfer base plate;
   a cooling member covering the fin portion and being connected to an inlet through which coolant to flow toward the fin portion flows in and an outlet through which coolant flowing from the fin portion flows out;
   a header being a water storage chamber that is provided between the inlet and the fin portion and is partitioned from the fin portion so as to be capable of allowing coolant to flow through from the inlet to the fin portion;
   a water flow control member being connected to the fin portion or the heat-transfer base plate and partitioning the header and the fin portion so as to be capable of allowing coolant to flow through from the header to the fin portion; and
   an outer-peripheral frame being connected to a lower surface of the heat-transfer base plate and surrounding a periphery of the fin portion;
   wherein:
   the water flow control member comprises a water flow control plate having an upper surface being connected to the outer-peripheral frame and the fin portion and a lower surface being connected to the cooling member; and
   an area of the water flow control plate is larger than any of an area of a portion surrounded by the outer-peripheral frame in a top view and an area of a portion surrounded by an outer peripheral portion of the cooling member in a top view.

2. The semiconductor device according to claim 1, wherein at least one of the inlet and the outlet is provided below the fin portion.

3. The semiconductor device according to claim 1, wherein:
   the cooling member covers the fin portion and the water flow control plate; and
   the header is formed by the water flow control plate and the cooling member.

4. The semiconductor device according to claim 1, wherein:
   the header is provided between the inlet and a bottom surface of the cooling member that is connected to the inlet; and
   a plurality of water passage holes capable of allowing coolant to flow through from the header to the fin portion are formed in the bottom surface of the cooling member.

5. The semiconductor device according to claim 1, wherein the plurality of projecting portions of the fin portion comprise at least one of a pin fin and a plate fin.

6. The semiconductor device according to claim 1, wherein the semiconductor element comprises a wide bandgap semiconductor.

7. The semiconductor device according to claim 1, wherein the fin portion and the heat-transfer base plate are connected by a joining member.

8. An inverter device comprising the semiconductor device of claim 1.

9. A vehicle comprising the semiconductor device of claim 1.

10. The semiconductor device according to claim 1, wherein:
    the header is formed by the water flow control plate and the cooling member; and
    the water flow control plate has a slit capable of allowing coolant to flow through from the header to the fin portion.

11. The semiconductor device according to claim 10, wherein:
    at least one of the outer-peripheral frame and the water flow control plate comprises Cu or an Al alloy; and
    the cooling member comprises a resin-based material.

12. A semiconductor device comprising:
    a semiconductor element;
    a heat-transfer base plate provided below the semiconductor element;
    a fin portion including a plurality of projecting portions that are connected to a lower surface of the heat-transfer base plate;
    a cooling member covering the fin portion and being connected to an inlet through which coolant to flow toward the fin portion flows in and an outlet through which coolant flowing from the fin portion flows out;
    a header being a water storage chamber that is provided between the inlet and the fin portion and is partitioned from the fin portion so as to be capable of allowing coolant to flow through from the inlet to the fin portion; and
    a water flow control member being connected to the fin portion or the heat-transfer base plate and partitioning the header and the fin portion so as to be capable of allowing coolant to flow through from the header to the fin portion,
    wherein:
    the water flow control member comprises a water flow control plate having an upper surface being connected to the fin portion and a lower surface being connected to the cooling member;
    the header is formed by the water flow control plate and the cooling member;
    the water flow control plate has a slit capable of allowing coolant to flow through from the header to the fin portion; and an end portion of the water flow control plate is bent toward a side of the heat-transfer base plate to be connected to the heat-transfer base plate, and surrounds a periphery of the fin portion.

13. A semiconductor device comprising:
a semiconductor element;
a heat-transfer base plate provided below the semiconductor element;
a fin portion including a plurality of projecting portions that are connected to a lower surface of the heat-transfer base plate;
a cooling member covering the fin portion and being connected to an inlet through which coolant to flow toward the fin portion flows in and an outlet through which coolant flowing from the fin portion flows out;
a header being a water storage chamber that is provided between the inlet and the fin portion and is partitioned from the fin portion so as to be capable of allowing coolant to flow through from the inlet to the fin portion; and
a water flow control member being connected to the fin portion or the heat-transfer base plate and partitioning the header and the fin portion so as to be capable of allowing coolant to flow through from the header to the fin portion,
wherein:
the water flow control member comprises a water flow control plate having an upper surface being connected to the fin portion and a lower surface being connected to the cooling member;
the header is formed by the water flow control plate and the cooling member;
the water flow control plate has a slit capable of allowing coolant to flow through from the header to the fin portion; and
an end portion of the heat-transfer base plate is bent toward a side of the water flow control plate to be connected to the water flow control plate, and surrounds a periphery of the fin portion.

14. A semiconductor device comprising:
a semiconductor element;
a heat-transfer base plate provided below the semiconductor element;
a fin portion including a plurality of projecting portions that are connected to a lower surface of the heat-transfer base plate;
a cooling member covering the fin portion and being connected to an inlet through which coolant to flow toward the fin portion flows in and an outlet through which coolant flowing from the fin portion flows out;
a header being a water storage chamber that is provided between the inlet and the fin portion and is partitioned from the fin portion so as to be capable of allowing coolant to flow through from the inlet to the fin portion; and
a water flow control member being connected to the fin portion or the heat-transfer base plate and partitioning the header and the fin portion so as to be capable of allowing coolant to flow through from the header to the fin portion,
wherein:
the inlet is provided below the heat-transfer base plate;
the water flow control member is perpendicularly connected to a lower surface of the heat-transfer base plate so as to surround an upper portion being a portion of the heat-transfer base plate positioned above the inlet;
the header is formed by the upper portion, the water flow control member, and the cooling member;
the fin portion is provided on a portion of the heat-transfer base plate other than the upper portion; and
the fin portion is omitted or a fin portion having a height lower than the fin portion is provided on the upper portion of the heat-transfer base plate.

15. The semiconductor device according to claim 14, wherein:
the water flow control member has a first slit capable of allowing coolant to flow through from the header to the fin portion that is provided below a first of the semiconductor element, and a second slit capable of allowing coolant to flow through from the header to the fin portion that is provided below a second of the semiconductor element having larger heat generation than the first of the semiconductor element; and
a width of the second slit is larger than a width of the first slit.

* * * * *